United States Patent [19] [11] 4,456,680
Nakamura et al. [45] Jun. 26, 1984

[54] PROCESS FOR PREPARING A MASK FOR SANDBLASTING

[75] Inventors: Shohei Nakamura; Yoshimasa Tuji, both of Fuji, Japan

[73] Assignee: Asahi Kasei Kogyo Kabushiki Kaisha, Osaka, Japan

[21] Appl. No.: 493,909

[22] Filed: May 12, 1983

[30] Foreign Application Priority Data

May 13, 1982 [JP] Japan ................... 57-79184

[51] Int. Cl.³ .................. G03C 11/12; G03C 1/90
[52] U.S. Cl. .................... 430/258; 430/260; 430/262; 430/263; 430/271
[58] Field of Search ............... 430/262, 263, 260, 259, 430/258

[56] References Cited

U.S. PATENT DOCUMENTS 2,678,510 5/1954 Fuerst et al. .................. 430/271
4,268,601 5/1981 Namiki et al. ................. 430/258 X
4,318,975 3/1982 Kuznetsov et al. ............ 430/263 X
4,389,480 6/1983 Franke et al. .................. 430/260 X

FOREIGN PATENT DOCUMENTS 53-09925 8/1978 Japan.
57-19416 1/1982 Japan.
1366769 9/1974 United Kingdom.

OTHER PUBLICATIONS

Abstract of Foreign Patent Document Japan 57-19416, Publication Date Mar. 22, 1976, as Japan 51-33619, Accession No. 34603x/19, Derwent Publications Ltd.

Primary Examiner—John E. Kittle
Assistant Examiner—Cynthia Hamilton
Attorney, Agent, or Firm—Sprung, Horn, Kramer & Woods

[57] ABSTRACT

A process for preparing a mask for sandblasting, in which there is employed a transparent soluble peel-aid film layer superimposed on a transparent protective film layer to cover a liquid photopolymerizable composition layer. According to the process, the protective film can be readily stripped and a mask for sandblasting which has a strong adherence to articles to be engraved can be produced efficiently without occurrence of troubles, such as chipping of high-precision portions, e.g. fine dots and lines, of polymeric images.

8 Claims, No Drawings

PROCESS FOR PREPARING A MASK FOR SANDBLASTING

This invention relates to a process for preparing a mask for sandblasting. More particularly, this invention is concerned with a process for preparing a mask for sandblasting, in which there is employed a transparent soluble peel-aid film layer superimposed on a protective film layer to cover a liquid photopolymerizable composition layer. The term "photopolymerizable composition" as used herein means the composition which is hardened by polymerization and/or crosslinking reaction upon exposure to actinic radiation. The transparent soluble peel-aid film layer has a small peeling resistance so that the protective film layer is easily stripped therefrom, and is washed away with an aqueous developer at the time of development.

Sandblasting, viz. a well-known technique for surface treatment in which steel grit, sand or other abrasive material is blown against an object, is useful for producing an engraved surface on a variety of materials such as glass, stone, ceramics, wood, synthetic resin, metal and leather. To engrave a desired image on such a material, usually, a mask having a pattern corresponding to the desired image is attached to the material, followed by engraving of the non-image portion of said pattern by blowing steel grit, sand or other abrasive material thereagainst. The present invention is directed to an improved process for preparing such a mask.

As disclosed in Japanese Patent Application Laid-Open Specification No. 53-99258/1978, it is known to prepare a mask for sandblasting by a process which comprises interposing a liquid photopolymerizable compositon layer between a support film and a protective film to form a photosensitive element, exposing the photosensitive element on its side of the protective film through an image-bearing transparency to actinic radiation, stripping the protective film, and washing away the unexposed portions of the photopolymerizable composition layer, followed by drying the resulting element. The so-prepared mask for sandblasting is attached to an article to be engraved with the surface of the mask remote from the support film disposed in contact with the surface of the article. Then, the support film is stripped, and subjected to sandblasting. As is anticipated from the foregoing, the support film should have a property of being readily stripped from the exposed photopolymerizable composition layer. Hence, the above-described process has an inherent drawback that chipping of high-precision portions of the image, such as fine dot and line, tends to occur, when performing the development for washing away the non-hardened portions upon exposure, due to the above-mentioned property of the support film. To overcome such a drawback, it is effective to interpose between the support film and the liquid photopolymerizable composition layer a layer which has adherence to the exposed photopolymerizable composition layer but allows the support film to be readily stripped therefrom, and which is destroyable by sandblasting.

On the other hand, it is advantageous to employ a mask for sandblasting which has sufficient stickiness to an article to be engraved and thus can be attached thereto without an adhesive. Accordingly, the resist layer obtained by exposure of the photopolymerizable composition layer and the subsequent development and drying is expected to have a sufficient stickiness to the article to be engraved by sandblasting. The sufficient stickiness of the resist layer is, however, disadvantageous when the protective film after image-wise exposure is stripped. Illustratively stated, due to the stickiness of the resist layer, the stripping of the protective film from the resist layer is hard work. Further, due to the stickiness of the resist layer, in stripping the protective film, there occasionally occur troubles, such as chipping of the polymeric image of the resist layer and peeling of the resist layer from the support film, so that occurrence of defective products becomes considerably high. Particularly, with respect to the above-mentioned element in which a layer having adherence to the exposed photopolymerizable composition layer but allowing the support film to be readily stripped therefrom is interposed between the photopolymerizable composition layer and the support film, the trouble of the peeling of the resist layer and interposed layer from the support film has been a grave problem in the art.

To overcome such a problem, it was proposed to use a protective film having one side thereof to be in contact with the photopolymerizable composition layer treated with a silicone release agent. The proposed method brings about a serious cost increase. On the other hand, it is not much effective. Further, it is accompanied by a drawback that the stickiness, to an article to be engraved, of the resist layer obtained by exposure of the photopolymerizable composition layer and the subsequent development and drying is disadvantageously decreased.

With a view to developing a process for preparing a mask for sandblasting which is free from any of the above-mentioned troubles, the present inventors have made intensive investigations.

As a result, it has been found, quite surprisingly, that all of the above-mentioned troubles can be resolved by interposing, between a liquid photopolymerizable composition layer and a transparent protective film layer, a transparent soluble peel-aid film layer which has a small peeling resistance so that the protective film layer is easily stripped therefrom and which is washed away with an aqueous developer at the time of development. Based on this novel finding, the present inventors have completed this invention.

It is, therefore, an object of the present invention to provide a process for preparing a mask for sandblasting which is free from any of the above-described drawbacks experienced in the prior art.

The foregoing and other objects, features and advantages of the present invention will be apparent to those skilled in the art from the following detailed description and appended claims.

According to the present invention, there is provided a process for preparing a mask for sandblasting, which comprises the steps of:

(1) interposing a liquid photopolymerizable composition layer between a destroyable retainer film layer strippably attached onto the lower surface of a support film layer and a transparent soluble peel-aid film layer superimposed on a transparent protective film layer, thereby to form a photosensitive element,
   said transparent soluble peel-aid film layer having a peeling resistance of 10 g/cm or less against the transparent protective film layer and being soluble in an aqueous developer;

(2) image-wise exposing the photosensitive element on its side of the transparent protective film layer through an image-bearing transparency to convert the liquid photopolymerizable composition layer to a layer having polymeric image portions and non-polymeric image portions;

(3) stripping the transparent protective film layer from the transparent soluble peel-aid film layer; and (4) washing away with the aqueous developer the transparent soluble peel-aid film layer and the non-polymeric image portions of the layer having polymeric image portions and non-polymeric image portions, thereby to provide polymeric image portions having their respective upper ends connected to the destroyable retainer film layer on its lower surface and having their respective free lower ends to be attached onto the surface of an article for sandblasting, said support film layer being adapted to be stripped from the destroyable retainer film layer while maintaining adherence of the destroyable retainer film layer to the respective upper ends of the polymeric image portions, said destroyable retainer film layer being adapted to be destroyed by sandblasting.

The transparent protective film layer to be employed in the process of the present invention is composed of a synthetic resin. As the suitable synthetic resin, there can be mentioned various kinds of polymers, such as polypropylene, polyesters, polyethylene, polystyrene, polyvinyl chloride, polyamides, cellulose acetate and polycarbonate. These synthetic resins may be used either singly or in mixture. In general, the transparent protective film layer has a thickness of from 5 to 50 microns. A protective film layer having a thickness greater than 50 microns is not suitable because the reproducibility of an image is decreased due to the increased scattering of light within the film. A protective film layer having a thickness smaller than 5 microns is also not suitable because the handling of the film becomes difficult. In particular, it is preferred that the thickness of the transparent protective film layer to be employed in the process of the present invention be in the range of from 9 to 25 microns.

It is to be noted that the oxygen permeability of the protective film layer affects the surface stickiness of the ultimate mask for sandblasting. When the oxygen permeability of the protective film layer is as small as less than $30 \times 10^{-6}$ g/24 hr/m²/mm-thickness/cm Hg (21° C.), the surface stickiness of the ultimate mask markedly drops. Hence, it is preferable to use a protective film layer having an oxygen permeability of $30 \times 10^{-6}$ g/24 hr/m²/mm-thickness/cm Hg(21° C.) in the present invention. From this viewpoint, as the suitable resin for forming the protective film layer to be employed in the present invention, there can be mentioned polypropylene, cellulose esters, polycarbonate, polyethylene and polystyrene. Of them, polypropylene is most suitable because it can form a protective film free from the trouble of the excess elongation during the mounting thereof on an image-bearing transparency and during other procedures and also free from the drawback of wrinkle formation or difficulty in intimate mounting on an image-bearing transparency, which drawback may be attributed to the excess hardness and brittleness of the film.

The transparent soluble peel-aid layer to be employed in the present invention allows the above-described transparent protective film layer to be readily stripped therefrom and can be dissolved in an aqueous developer, such as water per se, alkaline aqueous solution and aqueous solution of surface-active agent. It is needed that the peeling resistance of the transparent soluble peel-aid layer against the protective film layer be 10 g/cm or less as measured according to the method described later. A film having a peeling resistance greater than 10 g/cm causes the stripping of the protective film to be troublesome, whereby defective products are produced. As the suitable polymer for forming the transparent soluble peel-aid layer to be employed in the process of the present invention, there can be mentioned, for example, hydroxyalkyl group-containing cellulose ethers, hydroxyalkyl group-containing cellulose esters, carboxyl group-containing cellulose ethers, carboxyl group-containing cellulose esters and partially saponified polyvinyl acetates. The number-average molecular weight of the above-cited resins is in the range of from 10,000 to 500,000 g/mol, preferably from 20,000 to 100,000 g/mol, as measured according to the customary gel permeation chromatography method (using polystyrene as a reference material). With respect to the above-cited ethers, the degree of etherification is in the range of from 10 to 100%, preferably from 40 to 100%. With respect to the above-cited esters, also, the degree of esterification is in the range of from 10 to 100%, preferably from 40 to 100%. As the suitable hydroxyalkyl group-containing cellulose ether, there can be mentioned, for example, hydroxyethylcellulose and hydroxypropylcellulose. As the suitable hydroxyalkyl group-containing cellulose ester, there can be mentioned, for example, cellulose hydroxyacetate. Specific examples of the suitable carboxyl group-containing cellulose ether are carboxymethylcellulose and carboxyethylcellulose. Specific examples of the suitable carboxyl group-containing cellulose ester are esters of cellulose with either at least one member selected from polycarboxylic acids including dicarboxylic and tricarboxylic acids, such as succinic acid, adipic acid, sebacic acid, phthalic acid, isophthalic acid, terephthalic acid and trimellitic acid or a mixture of any of these polycarboxylic acids and a monocarboxylic acid, such as acetic acid, propionic acid, butyric acid or benzoic acid. The carboxyl group of the carboxyl group-containing cellulose ether and ester to be employed in the present invention may be in the form of a salt. The suitable polymers for forming the transparent soluble peel-aid layer to be employed in the present invention are not limited to the above-cited polymers, and any polymeric material may be used so far as it can form a film which allows the protective film to be readily stripped therefrom and can be removed by dissolution or dispersion into an aqueous developer at the step of development.

When the oxygen permeability of the soluble peel-aid layer is too small, the curing of the surface of the photopolymerizable or photocrosslinkable composition layer advances, at the step of exposure, to such an extent that the ultimate mask for sandblasting disadvantageously has a poor stickiness to articles to be engraved. From this viewpoint, the cellulose derivatives having a high oxygen permeability are preferred.

Hydroxyalkyl group-containing cellulose ethers and esters and partially saponified polyvinyl acetate are affected by the moisture absorption during the storage thereof. Therefore, attention should be paid to the storage conditions of such materials. From this viewpoint, carboxyl group-containing cellulose esters and ethers, especially esters of cellulose with a mixture of polycarboxylic acid and monocarboxylic acid, are preferred, which exhibit a low moisture pickup and which are soluble in a weak alkaline aqueous solution and/or an aqueous solution of surface-active agent. Of them, cellulose acetate phthalate is most preferable because it is readily available.

In general, the transparent soluble peel-aid film layer to be employed in the present invention has a thickness of from 0.1 to 10 microns. A peel-aid film layer having a thickness greater than 10 microns is not suitable because the reproducibility of an image is decreased. A peel-aid film layer having a thickness smaller than 0.1 micron is also not suitable because thickness control during production steps becomes difficult and because troubles, such as pin-hole formation, tend to increasingly occur. It is preferred that the thickness of the transparent soluble peel-aid film layer to be employed in the present invention be in the range of from 0.2 to 5 microns.

The transparent soluble peel-aid film layer can be superimposed on the transparent protective film layer according to customary procedures. For example, the above-cited polymer for forming the peel-aid film layer is dissolved in an appropriate solvent to prepare a solution. Then, the solution is coated on the protective film by means of a bar coater, spin coater or gravure coater, and dried.

Japanese Patent Application Laid-Open Specification No. 51-33619/1976 discloses a process for printing a relief which comprises erasing a liquid photopolymerizable composition layer through an image-bearing transparency to actinic radiation to form a polymeric image in the layer and removing the portions of the layer other than the polymeric image, characterized in that a film of a polymer selected from the group consisting of polypropylene, polyvinyl acetate and polycarbonate, said film having a thickness of from 0.005 to 0.1 mm, is interposed between the liquid photopolymerizable composition layer and the image-bearing transparency, and that a layer consisting essentially of a cellulose ester having an ester group from a carboxylic acid of the formula:

R·COOH in which R represents an alkyl group containing two or more carbon atoms,
and having a thickness of from 0.05 to 10 microns is superimposed on at least one side of the film in contact with the photopolymerizable composition layer. The invention of this reference is directed to a process free from the problem of the distortion or deformation of relief images occurring at the step of exposure in the production of a printing plate. The process is not a one for preparation of a printing plate using a strippable support film. In the disclosure of invention of the specification, there is a description to the effect that in the case of a cellulose ester layer having a thickness greater than 10 microns, part of the layer is disadvantageously transferred to the photopolymerizable composition layer at the time of relief formation, causing part of the relief image to be buried. As is seen from the foregoing, the layer consisting essentially of a cellulose ester having an ester group is insoluble in a developer. Any mask in which this layer is interposed between the protective film layer and the photopolymerizable composition layer has not sufficient stickiness to articles to be engraved, wherefore it is not useful for actual sandblasting application.

As the suitable support film layer to be employed in the process of the present invention, there can be mentioned, for example, transparent films of synthetic resins, such as polypropylene, polyesters, polyvinyl chloride, polycarbonate, polystyrene and polyethylene, and sheets of metals, such as steel and aluminum. In general, the support film layer has a thickness of from 50 μm to 1 mm. A support film having a thickness greater than 1 mm is not suitable because the handling thereof in forming a mask becomes difficult. A support film having a thickness smaller than 50 μm is also not suitable because the nerve of the film is insufficient so that the function of the support cannot be fulfilled.

With respect to the destroyable retainer film layer to be interposed between the liquid photopolymerizable composition layer and the support film layer for the purpose of preventing the chipping of high-precision portions of the image, such as fine dot and line, when performing the development for washing away the non-hardened portions upon exposure, it is requisite that the retainer film allow the support film layer to be readily stripped therefrom while having sufficient adherence to the polymeric image generated by exposure of the photopolymerizable composition layer, and that the retainer film be destroyable by sandblasting. From the viewpoint of the workability of stripping, it is preferred that the peeling resistance between the destroyable retainer film layer and the support film layer be less than 10 g/cm as measured according to the method described later.

As the suitable material for forming the destroyable retainer film layer to be employed in the process of the present invention, there can be mentioned, for example, cellulose derivatives, such as cellulose ethers and esters, acrylic resins, such as polymethyl methacrylate, polystyrene and petroleum resin. From the viewpoint of the adherence to the polymeric image generated by exposure of the photopolymerizable or photocrosslinkable composition layer, however, cellulose derivatives are more preferable. Further, the material for forming the destroyable retainer film layer must be insoluble in an aqueous developer, such as water per se, alkaline aqueous solution and aqueous solution of surface-active agent, in order to prevent the polymeric image from parting at the time of development. From this viewpoint, of the cellulose derivatives, alkylcelluloses, such as ethylcellulose and methylcellulose, and cellulose monocarboxylic esters, such as cellulose acetate and cellulose acetate butylate, are most preferred.

In general, the destroyable retainer film layer to be employed in the process of the present invention has a thickness of from 0.5 to 20 microns. A retainer film layer having a thickness smaller than 0.5 micron is not suitable because its capability of retaining of the polymeric image becomes insufficient. A retainer film layer having a thickness greater than 20 microns is also not suitable because production of a composite film in which the retainer film layer is superimposed on a support film layer becomes difficult, and because the use of a thick film is not economical.

The liquid photopolymerizable composition layer to be employed in the process of the present invention provides, upon exposure to actinic radiation, a polymeric image which functions as a resist layer against sandblasting and which has such a strong adherence to articles to be engraved as 300 g/cm or more in terms of peeling resistance as measured at 20° C. according to the method described later. The unexposed, non-polymeric image portions of the layer is washed away with an aqueous developer, such as water per se, alkaline aqueous solution and aqueous solution of surface-active agent.

As the suitable liquid photopolymerizable composition layer to be employed in the process of the present invention, there can be mentioned various kinds of compositions, including, but not limited thereto, the following composition, which comprises:

(1) an unsaturated polyurethane of the formula:

$$HB(XA)_nXBH$$

wherein X represents a urethane residue, A represents a polyether, a polyester, a block copolymer of polyether and polyester, a mixture thereof or a polybutadiene n represents an integer of 1 to 10, and B represents a compound of the formula:

$$CH_2=C(Z)\underset{O}{\overset{\|}{C}}O-Y$$

in which Z represents a hydrogen atom or a methyl group, and Y represents $-(CH_2)_{m_1}O-$ in which $m_1$ represents an integer of 2 to 6, $$-(CH_2CH-O)_{\overline{m_2}}$$
$$\qquad |$$
$$\quad CH_3$$

in which $m_2$ represents an integer of 1 to 12, or $-(CH_2CH_2O)_{\overline{m_3}}$ in which $m_3$ represents an integer of 1 to 12, (2) an ethylenically unsaturated compound, and
(3) a photopolymerization initiator.

Specific examples of such an ethylenically unsaturated compound are acrylic acid, methacrylic acid, esters of these acids (for example, alkyl, cycloalkyl, tetrahydrofurfuryl, allyl, glycidyl and hydroxyalkyl acrylates and methacrylates, mono and di-acrylates and -methacrylates of alkylene glycols and polyoxyalkylene glycols, trimethylolpropane tri-acrylate and -methacrylate and pentaerythritol tetra-acrylate and -methacrylate), acrylamide, methacrylamide and their derivatives (such as N-methylol acrylamide and methacrylamide, N,N'-alkylene bisacrylamides and methacrylamides, and diacetone acrylamide and methacrylamide), addition-polymerizable unsaturated monomers (such as styrene, vinyl toluene, divinyl benzene, diallyl phthalate, triallyl cyanurate, vinyl acetate or acrylonitrile), unsaturated polyesters, alkyd resins, and unsaturated polyurethane resins (such as polyurethane resins modified with an addition-polymerizable unsaturated monomer having an active hydrogen such as a hydroxyalkyl acrylate and methacrylate).

Specific examples of such a photopolymerization initiator are benzoin, benzoin alkyl esters, α-methylbenzoin alkyl ethers, α-phenylbenzoin, α-allylbenzoin, 2,2-dimethoxylphenylacetophenone, anthraquinone, chloroanthraquinone, methylanthraquinone, ethylanthraquinone, benzil, diacetyl, acetophenone, ω-bromoacetophenone, α-naphthalenesulfonyl chloride, diphenyl disulfide, and dyes such as eosine and thionine.

The liquid photopolymerizable composition layer to be employed in the process of the present invention has a thickness of from 0.05 to 3 mm. A photopolymerizable composition layer having a thickness greater than 3 mm is not suitable because the resolution of image drops. A photopolymerizable composition layer having a thickness smaller than 0.05 mm is also not suitable because the function as a resist layer against sandblasting cannot be fulfilled.

The sources of actinic radiation for exposure which can be used in the process of the present invention can be freely selected and include, for example, arc lamps, mercury lamps, xenon lamps, ultraviolet fluorescent lamps and sunlight, which contain radiation of a wavelength of 200-800 mμ, preferably 300 to 500 mμ.

After exposure to actinic radiation, the unexposed portion of the photopolymerizable composition layer is washed away, together with the soluble peel-aid film layer, with a conventional developer, for example, water, an alkaline aqueous solution, such as solutions of NaOH, NaCO$_3$, NaHCO$_3$, borax, sodium phosphate, sodium silicate, triethanolamine, or the like, or an aqueous solution of surface active agent, such as a soap, alkylbenzene sulfonate, alkylsulfonate, alkylamine hydrochlorides, polyoxyalkylene glycol, polyoxyalkylene glycol alkylether, polyoxyalkylene glycol alkylester, sorbitan fatty acid ester, polyoxyalkylene glycol sorbitan acid ester or the like.

As is apparent from the foregoing description of the process of the present invention, the adherence between the transparent protective film layer and the transparent soluble peel-aid film layer is so weak that the protective film layer can be stripped without adversely affecting the other layers of the photosensitive element after exposure. Further, after development for washing away the transparent soluble peel-aid film layer and the non-polymeric image portions of the layer having polymeric image portions and non-polymeric image portions, the resulting mask is attached to an article to be engraved with the respective lower ends of the polymeric image portions adhered to the surface of the article. The adherence between the respective lower ends of the polymeric image portions of the mask and the surface of the article to be engraved is sufficiently strong as compared with the adherence between the support film layer and the destroyable retainer film layer. Also, the adherence between the destroyable retainer film layer and the respective upper ends of the polymeric image portions of the layer having polymeric image portions and non-polymeric image portions of the mask is much stronger than that between the support film layer and the destroyable retainer film layer. Hence, the support film layer can be stripped while maintaining adherence of the destroyable retainer film layer to the respective upper ends of the polymeric image portions as well as adherence of the respective lower ends of the polymeric image portions to the article to be engraved by sandblasting.

The resulting element, which comprises a support film layer and, superimposed on the layer in the following order, a destroyable retainer film layer and a polymeric image, is allowed to stand at room temperature or dried by means of warm or hot air before attaching to articles to be engraved.

The process of the present invention is useful especially when a photopolymerizable composition which provides, upon exposure and development, a very sticky polymeric image is to be utilized. According to the process of the present invention, even if the polymeric image produced from the photopolymerizable composition is very sticky, the protective film layer can be easily stripped, and, thereby, a mask for sand-blasting which has strong adherence to articles to be engraved can be produced without occurrence of defective products.

The present invention will be illustrated in more detail with reference to the following Examples, which should not be construed to be limiting the scope of the present invention.

In the following Examples and Comparative Examples, the peeling resistance of the mask for sandblasting against a glass plate and the peeling resistance between the protective film layer and the peel-aid film layer were measured according to the following methods.

(1) Measurement of the peeling resistance of the mask for sandblasting against a glass plate The peeling resistance is measured using the Picma Tack Tester manufactured and sold by Toyo Seiki Co. Ltd., Japan. Illustratively stated, a mask for sandblasting is, at a temperature of 20° C., attached to the curved surface of a cylindrical column of aluminum having a height of 13 mm and a diameter of 30 mm by means of a double faced adhesive tape. The mask for sandblasting attached to the cylindrical column is then pressed onto the surface of a glass plate for 4 seconds under a pressure of 500 g/cm$^2$. Subsequently, the mask is pulled from the glass plate at a rate of 30 mm/min to determine the peeling resistance.

(2) Measurement of the peeling resistance between the protective film layer and the peel-aid film layer An element comprising a protective film layer and a peel-aid film layer is cut into a rectangular specimen having a width of 1 cm. Then, at a temperature of 20° C., the peeling resistance between the protective film layer and the peel-aid film layer is measured by means of an Autograph P-100 (trademark of a tensile strength tester manufactured and sold by Shimadzu Corporation, Japan) at a pulling rate of 500 mm/min.

EXAMPLE 1

A 10% by weight solution of cellulose acetate phthalate (having a number average molecular weight of 40,000) in a 6:1 by weight mixture of methyl ethyl ketone and cellosolve acetate was coated, by using a bar coater, on a 22$\mu$-thick polypropylene film, followed by drying. As a result, there was obtained a polypropylene film having thereon a layer of cellulose acetate phthalate having a thickness of 2$\mu$ (Film A).

A 20% by weight solution of ethyl cellulose (having a number average molecular weight of 60,000) in methyl ethyl ketone was coated, by using a bar coater, on a 75$\mu$-thick polyethylene terephthalate film, followed by drying. As a result, there was obtained a polyethylene terephthalate having thereon a layer of ethyl cellulose having a thickness of 8$\mu$ (Film B).

39 Parts by weight of polypropylene glycol adipate diol (having a number average molecular weight of 2,500), 39 parts by weight of polypropylene glycol (ethylene oxide being addition-bonded to both ends of the polyethylene glycol chain in an amount of 10% by weight, having a number average molecular weight of 2,500) and 6 parts by weight of tolylene diisocyanate (a mixture consisting of 80% by weight of 2,4-isomer and 20% by weight of 2,6-isomer) were reacted to obtain a polyurethane having isocyanate groups at both ends thereof. 15 Parts by weight of 2-hydroxypropyl methacrylate was added to the thus obtained polyurethane, and reaction was effected between the polyurethane and 2-hydroxypropyl methacrylate, whereby an unsaturated polyurethane having methacrylate groups at both ends thereof was obtained. To the thus obtained unsaturated polyurethane, added under agitation were 20 parts by weight of polypropylene glycol monomethacrylate (having a number average molecular weight of 550), 3 parts by weight of diethylene glycol dimethacrylate, 1.5 parts by weight of 2,2-dimethoxyphenyl acetophenone and 0.1 part by weight of 2,6-di-t-butyl-p-cresol, whereby a photopolymerizable composition in the form of liquid was obtained.

A positive photographic film was placed on a 10 mm-thick glass plate. The positive film was then covered with the above-obtained film A in such a way that the polypropylene film in the film A was brought into contact with the positive film. Then, the photopolymerizable composition in the form of liquid was poured into a space defined by the film A and a 0.3 mm-thick spacer placed on the film A. Subsequently, the film B was laminated onto the surface of the photopolymerizable composition in such a way that the layer of ethyl cellulose superimposed on the polyethylene terephthalate film in the film B was brought into contact with the surface of the photopolymerizable composition. Onto the polyethylene terephthalate film of the film B, a 10 mm-thick glass plate was placed to obtain an element. Each corner of the resulting element was clasped with a clip, thereby controlling the entire thickness of the element. The element was exposed, through the positive photographic film, to actinic radiation from a 2 KW high pressure mercury lamp placed at a distance of 50 cm for 80 seconds. After exposure to actinic radiation, the glass plates and the positive film were removed, and the polypropylene film in the film A was stripped off. At that time, the peeling resistance between the polypropylene film and the layer of cellulose acetate phthalate was measured according to the above-described method and found to be as small as 1 g/cm. Chipping of the polymeric image generated by exposure of the photopolymerizable composition layer was not observed. Subsequently, the unexposed non-polymeric image portions of the photopolymerizable composition were washed away, together with the layer of cellulose acetate phthalate, by spraying a 2% by weight aqueous solution of surface-active agent (Lipon F; manufactured and sold by Lion Corporation, Japan) for 150 seconds at a pressure of 0.8 kg/cm. Any chipping of the polymeric image generated by exposure of the photopolymerizable composition was not observed. The thus treated element was dried for 10 minutes at 60° C. to obtain a mask for sandblasting.

After cooling to 20° C., the thus obtained mask for sandblasting was subjected to measurement of the peeling resistance against a glass plate. The peeling resistance of the mask for sandblasting against a glass plate was found to be 600 g/cm.

The mask for sandblasting was then applied to a 7 mm-thick glass plate and the polyethylene terephthalate film in the film B was stripped off. There was observed substantially no peeling resistance between the polyethylene terephthalate film and the layer of ethyl cellulose. Subsequently, the glass plate covered with the mask for sandblasting was sandblasted by means of a siphon-type sandblaster (manufactured and sold by Fuji Seisakusho, Japan), using as an abrasive material an alundum (crystal almina obtained from molten bauxite) having a grain size of #180 according to Japanese Industrial Standard R6001. The sandblasting was effected for 30 seconds under a pneumatic pressure of 3.5 kg/cm$^2$. The desired images were, in the complete form, engraved on the glass plate without breakaway of the mask.

Comparative Examples 1 and 2

Masks for sandblasting were prepared in substantially the same manner as described in Example 1 except that a 22μ-thick polypropylene film and a 22μ-thick polypropylene film having thereon a 2μ-thick layer of cellulose acetate butyrate were respectively used as the protective film instead of the film A. The peeling resistance of each of the thus obtained masks for sandblasting against a glass plate was measured. The results are shown in Table 1.

TABLE 1

| Example No. | Protective film | Occurrence of chipping of cured portion of photopolymerizable composition* | Peeling resistance of mask against glass plate, g/cm |
|---|---|---|---|
| Comparative Example 1 | A polypropylene film | Chipping of a 260μ-wide fragment occurred | 600 |
| Comparative Example 2 | A polypropylene film having thereon a 2μ-thick layer of cellulose acetate butyrate | not occurred | 20 |

Note:
*Examined when the protective film was stripped off.

Examples 2 and 3 and Comparative Examples 3 and 4

Masks for sandblasting were prepared in substantially the same manner as described in Example 1 except that in place of the film A and the film B, various films as indicated in Table 2 were employed as the protective film or the support film. The peeling resistance of each of the resulting masks for sandblasting against a glass plate was measured. The results obtained are shown in Table 2.

TABLE 2

| Example No. | Protective film | Support film | Occurrence of chipping of cured portion of photopolymerizable composition(1) | Occurrence of chipping of cured portion of photopolymerizable composition(2) | Peeling resistance of mask against glass plate, g/cm |
|---|---|---|---|---|---|
| 2 | A 22μ-thick polypropylene film having thereon a 0.5μ-thick layer of cellulose acetate phthalate | Film B | not occurred | not occurred | 600 |
| 3 | A 22μ-thick polypropylene film having thereon a 5μ-thick layer of hydroxypropyl cellulose | Film B | not occurred | not occurred | 600 |
| Comparative Example 3 | A 22μ-thick polypropylene film having thereon a 0.5μ-thick layer of cellulose acetate phthalate | A 75μ-thick polyester film | not occurred | occurred | 600 |
| Comparative Example 4 | A 22μ-thick polypropylene film | A 75μ-thick polyester film | occurred | occurred | 600 |

Note:
(1)Examined when the protective film was stripped off.
(2)Examined when the unexposed portion of the photopolymerizable composition and the layer superimposed on the protective film were dissolved off.

Examples 4 to 7

Masks for sandblasting were prepared in substantially the same manner as described in Example 1 except that in place of the film A, various films as indicated in Table 3 each having thereon a layer of cellulose acetate phthalate were employed as the protective film. In each of Examples 4 to 7, the protective film was easily removed from the layer of cellulose acetate phthalate. Any chipping of the cured portion of the photopolymerizable composition was not observed. The peeling resistance of each of the masks for sandblasting against a glass plate was measured. The results obtained are shown in Table 3.

TABLE 3

| Example No. | Film to be used as protective film (thickness, μ) | Thickness of the layer of cellulose acetate phthalate, μ | Peeling resistance of mask against glass plate, g/cm |
|---|---|---|---|
| 4 | A polycarbonate film (30μ) |  | 600 |
| 5 | A cellulose acetate film (25μ) | 0.5 | 610 |
| 6 | A polyethylene film (40μ) | .5 | 590 |
| 7 | A polystyrene film (30μ) | 4 | 590 |

Examples 8 to 11 and Comparative Examples 5 to 7

Each of the layers as indicated in Table 5 was superimposed on a 30μ-thick polypropylene film. By using the resulting composite films, a series of elements were prepared in substantially the same manner as described in Example 1 except that the positive photographic film was not used. Each of the thus prepared elements was subjected to exposure to actinic radiation in the same manner as described in Example 1. After exposure to actinic radiation, a 1 cm-wide specimen was cut out from each element, and subjected to measurement of the peeling resistance of the protective film against the layer provided thereon. The remaining portion of each element was developed and dried in the same manner as described in Example 1 n a mask for sandblasting. Each of the resulting masks for sandblasting was subjected to measurement of the peeling resistance against a glass plate. The results obtained are shown in Table 5.

TABLE 5

| Example No. | Layer superimposed on a polypropylene film (thickness, μ) | Peeling resistance of protective film, g/cm | Peeling resistance of mask against glass plate, g/cm |
| --- | --- | --- | --- |
| 8 | A cellulose acetate phthalate layer (5μ) | 1.0 | 590 |
| 9 | A hydroxypropyl cellulose layer (2μ) | 1.5 | 600 |
| 10 | A carboxymethyl cellulose layer (1μ) | 1.0 | 610 |
| 11 | A cellulose butyrate phthalate layer (1.5μ) | 1.0 | 600 |
| Comparative Example 5 | A cellulose acetate adipate layer (1μ) | 1.0 | 600 |
| Comparative Example 6 | A cellulose adipate layer (3μ) | 1.5 | 590 |
| Comparative Example 7 | None | 67 | 600 |

What is claimed is:

1. A process for preparing a mask for sandblasting, which comprises the steps of:
   (a) interposing a liquid photopolymerizable composition layer between a destroyable retainer film layer strippably attached onto the lower surface of a support film layer and a transparent soluble peel-aid film layer superimposed on a transparent protective film layer, thereby to form a photosensitive element,
   said transparent soluble peel-aid film layer having a peeling resistance of 10 g/cm or less against the transparent protective film layer and being soluble in an aqueous developer;
   (b) image-wise exposing the photosensitive element on its side of the transparent protective film layer through an image-bearing transparency to convert the liquid photopolymerizable composition layer to a layer having polymeric image portions and non-polymeric image portions;
   (c) stripping the transparent protective film layer from the transparent soluble peel-aid film layer; and
   (d) washing away with the aqueous developer the transparent soluble peel-aid film layer and the non-polymeric image portions of the layer having polymeric image portions and nonpolymeric image portions, thereby to provide polymeric image portions having their respective upper ends connected to the destroyable retainer film layer on its lower surface and having their respective free lower ends to be attached onto the surface of an article for sandblasting,
   said support film layer being adapted to be stripped from the destroyable retainer film layer while maintaining adherence of the destroyable retainer film layer to the respective upper ends of the polymeric image portions,
   said destroyable retainer film layer being adapted to be destroyed by sandblasting.

2. A process according to claim 1, wherein said transparent soluble peel-aid film layer is a film of at least one member selected from the group consisting of hydroxyalkyl group-containing cellulose ethers, hydroxyalkyl group-containing cellulose esters, carboxyl group-containing cellulose ethers, carboxyl group-containing cellulose esters and partially saponified polyvinyl acetates.

3. A process according to claim 2, wherein said transparent soluble peel-aid film layer is a film of at least one member selected from the group consisting of carboxyl group-containing cellulose esters and carboxyl group-containing cellulose ethers.

4. A process according to claim 3, wherein said transparent soluble peel-aid film layer is a film of cellulose acetate phthalate.

5. A process according to claim 1, wherein said transparent protective film layer is a film of polypropylene.

6. A process according to claim 1, wherein said destroyable retainer film layer has a peeling resistance of 10 g/cm or less against the support film layer.

7. A process according to claim 6, wherein said destroyable retainer film layer is a film of at least one member selected from the group consisting of cellulose monocarboxylic esters and alkylcelluloses.

8. A photosensitive element comprising a support film layer and, superimposed on the support film in the following order, a destroyable retainer film layer, a liquid photopolymerizable composition layer, a transparent soluble peel-aid film layer and a transparent protective film layer,
   said transparent soluble peel-aid film layer having a peeling resistance of 10 g/cm or less against the transparent protective film layer and being soluble in an aqueous developer,
   said support film layer being adapted to be stripped after exposure of the photopolymerizable composition layer, from the destroyable retainer film layer while maintaining adherence of the destroyable retainer film layer to the exposed photopolymerizable composition layer,
   said destroyable retainer film layer being adapted to be destroyed by sandblasting.

* * * * *

UNITED STATES PATENT AND TRADEMARK OFFICE
CERTIFICATE OF CORRECTION

PATENT NO. : 4,456,680
DATED : June 26, 1984
INVENTOR(S) : Shohei Nakamura et al It is certified that error appears in the above-identified patent and that said Letters Patent is hereby corrected as shown below:

Column 7, line 10, Cancel "$HB(XA)_n XBH$" and substitute

--$B(XA)_n XB$--

Signed and Sealed this

Twenty-sixth Day of March 1985

[SEAL]

Attest:

DONALD J. QUIGG

Attesting Officer     Acting Commissioner of Patents and Trademarks